United States Patent [19]

Love et al.

[11] 4,034,243
[45] July 5, 1977

[54] LOGIC ARRAY STRUCTURE FOR DEPLETION MODE-FET LOAD CIRCUIT TECHNOLOGIES

[75] Inventors: Robert D. Love, Burke; James W. Cullen, Fredericksburg; Robert W. Kruppa, Manassas, all of Va.

[73] Assignee: International Business Machines Corporation, Armonk, N.Y.

[22] Filed: Dec. 19, 1975

[21] Appl. No.: 642,513

[52] U.S. Cl. .................................. 307/304; 357/23; 357/68; 357/24; 307/215; 340/166 R
[51] Int. Cl.² ................ H03K 3/353; H03K 19/34; H01L 29/78; H01L 23/48
[58] Field of Search ................. 357/23, 65, 68, 24; 307/304, 215; 340/166

[56] References Cited

UNITED STATES PATENTS

| | | |
|---|---|---|
| 3,761,784 | 9/1973 | Jund .................................... 357/23 |
| 3,896,482 | 7/1975 | Brechling ........................... 357/23 |
| 3,911,289 | 10/1975 | Takemoto ........................... 357/23 |
| 3,916,268 | 10/1975 | Engeler et al. ....................... 357/23 |
| 3,943,551 | 3/1976 | Skorup .................................. 357/23 |

Primary Examiner—Andrew J. James
Attorney, Agent, or Firm—John E. Hoel

[57] ABSTRACT

A depletion mode load device structure is disclosed which improved upon the existing Weinberger layout technique, as applied to enhancement mode/depletion mode circuitry. The structure of an FET, self biased load device includes a single metallized vertical line performing three functions: a source contact for the FET device, the gate electrode for the FET device, and the output line for the circuit for which the device serves as the load. Use of this structure results in an increased horizontal circuit packing density, which is particularly useful in the decoder circuits for a programmed logic array.

21 Claims, 10 Drawing Figures

LOGIC ARRAY STRUCTURE FOR DEPLETION MODE-FET LOAD CIRCUIT TECHNOLOGIES

FIELD OF THE INVENTION

The invention disclosed generally relates to field effect transistor circuitry and more particularly relates to the device structure of a depletion mode FET load.

BACKGROUND OF THE INVENTION

Standardized FET integrated circuit layouts have heretofore been based upon the master-slice method. In the master-slice method, a standardized array of diffusion shapes is deposited on the wafer with the intention of imparting all circuit personality by means of variations in the location and interconnection of the overlying metallized gates and thin oxide. Master-slice has the same basic diffusion pattern. A December, 1967 article by A. Weinberger in the IEEE Journal of Solid State Circuits, Vol. SC2, No. 4, Pages 182–190, illustrates the master-slice method. An FET integrated circuit arrangement is disclosed consisting of a spaced parallel diffusion pattern to be embodied in a semi-conducting wafer, with interconnection metallization to be embodied on a higher level. The layout method comprises the steps of repeating the diffusion rows across the chip to form the fixed, master slice diffusion pattern. Wafers with this fixed diffusion pattern are stock piled for future circuit personalization by means of locating metallized gates thereover. The layout permits but a single degree of freedom in circuit personalization through the placement of metallized gates over the fixed diffusions forming the FET devices. Variations in the personalized interconnection of the diffusion rows can only be accomplished by varying the position of the metallized gates along the respective diffusion row axes and the interconnection of those metallized gates by means of via-holes with the fixed diffusions. This prior art standardized one dimensional layout. The method works well for moderate density integrated circuit devices with a low order of logical complexity, however, its inherent lack of flexibility in the location and interconnection of device nets precludes its applicability to high density integrated circuit applications embodying complex logical functions.

Greater circuit layout flexibility and packing density is required to obtain higher logic power per unit area for large scale integrated circuits.

OBJECTS OF THE INVENTION

It is therefore an object of the invention to increase the circuit packing density for a large scale integrated circuit.

It is still another object of the invention to increase the flexibility of circuit layout for a large scale integrated circuit.

It is still a further object of the invention to provide an improved circuit structure for FET static circuits.

It is yet another object of the invention to provide an improved circuit layout structure for depletion mode load FET circuitry.

SUMMARY OF THE INVENTION

These and other objects, features and advantages of the invention are provided by an improved configuration of an FET depletion mode load device disclosed herein. The invention finds put together application in an FET logic function layout including a spaced parallel array of horizontal diffusion segments in the surface of a semiconductor substrate having an insulating layer deposited over the surface of the substrate and having a parallel spaced array of vertical metallized lines deposited over the insulating layer. The improvement in the configuration of an FET depletion load mode device in a static logic array includes a first one of the horizontal diffusion segments which serves as a drain diffusion of the FET static load device. There is a second one of the horizontal diffusion segments spaced from the first horizontal diffusion, which serves as the source diffusion for the FET static load device. The first horizontal diffusion is juxtaposed with the second horizontal diffusion an defines a channel region therebetween and the substrate. The insulating layer has a thinner portion over the channel region and a via-hole perforation over the second horizontal diffusion. A vertical metallized line is deposited over the first and second diffusion segments forming an electrically conducted source contact with the second horizontal diffusion through its via-hole, also forming the gate electrode by its close proximity in the thinner portion of the insulator, to the channel region, and in addition forming the output electrode for the device. This compact structural configuration for an FET load device permits a smaller number of metallized lines and via-holes necessary to make up the structure of a circuit incorporating the FET load device, which increases the horizontal circuit packing density and enhances the circuit layout flexibility on the resulting large scale integrating circuit.

DESCRIPTION OF THE FIGURES

These and other objects, features and advantages of the invention will be more readily appreciated with reference to the accompanying figures:

FIG. 1b is a cross sectional view along the line B—B prime of FIG. 1a for the FET depletion mode load device 1a.

FIG. 1c is a schematic diagram of the circuit for the program logic area decoder shown in FIG. 1a.

FIG. 2c is a schematic diagram illustrating the flip-flop circuit of FIG. 2a.

FIG. 2d illustrates an alternate embodiment employing a diffusion bar 28' instead of the metal bus bar 24 of FIG. 2a.

DISCUSSION OF THE PREFERRED EMBODIMENT

The MOSFET devices disclosed herein are field effect transistors fabricated by diffusing speed, N type source and drain regions into a P type substrate, forming an insulating gate such as silicon dioxide over the channel region between the source and drain regions, and then forming a conductive gate electrode over the channel region. This type of device is an enhancement mode N-channel transistor. Assuming that the source region of such a device is at ground potential, and that the drain region is biased to a positive voltage, the device will conduct whenever the gate to source voltage $V_{GS}$ is more positive than the threashold voltage $V_T$ of the device, where $V_T$ is always a positive value. When the magnitude of $V_{GS}$ is less than $V_T$, no significant conduction will occur.

The circuits disclosed herein also utilize N-channel, depletion mode MOSFET devices which have the same configuration as above, but have a N-channel between the diffused regions produced by the process of ion implantation. An example of a process for the implantation of N-channel devices is disclosed in L. Forbes, *IEEE Journal of Solid State Electronics*, June 1973, pages 226–230. An example of the ion implantation process for P-channel MOSFET devices is disclosed in M. Hswe, et al., *Solid State Electronics*, 1972, Volume 15, pages 1237–1243. Other processes for fabricating depletion modes FET devices may be found, for example, in U.S. Pat. No. 3,653,978 issued Apr. 4, 1972 to Robinson, et al. or U.S. Pat. No. 3,868,274 issued Feb. 25, 1975 to Huber, et al. As a result, the depletion mode devices conduct whenever the gate to source voltage $V_{GS}$ is more positive than the pinch off voltage $V_P$ of the device, where $V_P$ is always negative. In order to stop conduction, the gate voltage with respect to the source voltage must be more negative than the pinch off voltage. Thus, if the gate is at the same potential as the source, the device nevertheless continues to conduct.

It is to be understood that the present invention is equally applicable to P-channel transistors as it is to the disclosed N-channel transistor embodiment. The P-channel enhancement mode and depletion mode devices operate in the same way as the corresponding N-channel enhancement and depletion mode devices, with the exception that the polarity of the voltages is reversed. Accordingly, as disclosed herein, the term low voltage refers to the source which is shown as ground potential and the term high voltage refers to the drain voltage which is a negative voltage for P-channel devices and a positive voltage for N-channel devices. Occasionally it will also be convenient to refer to the higher or drain voltage levels as the logical one level, which for a P-channel device would typically be from −5 to −17 volts and for N-channel devices would typically be from +5 to +17 volts. Similarly, the source, ground or lower voltage levels will be occasionally referred to as the logical zero level; typically 0 to 2.21 volts, positive for N-channel and negative for P-channel.

A depletion mode load device structure is disclosed which improves upon the existing Weinberger layout technique, as applied to enhancement-depletion circuitry. The structure of an FET, self biased load device, includes a single metallized vertical line performing three functions: a source contact for the FET device, the gate electrode for the FET device, and the output line for the circuit for which the device serves as a load. Use of this structure results in an increased horizontal circuit packing density, which is particularly useful in the logic and decoder circuits of a programmed logic array. An interdigitated bus bar configuration is disclosed for supplying drain voltage and ground voltage to a static logic array employing the disclosed depletion mode load device invention.

Figure 1A:
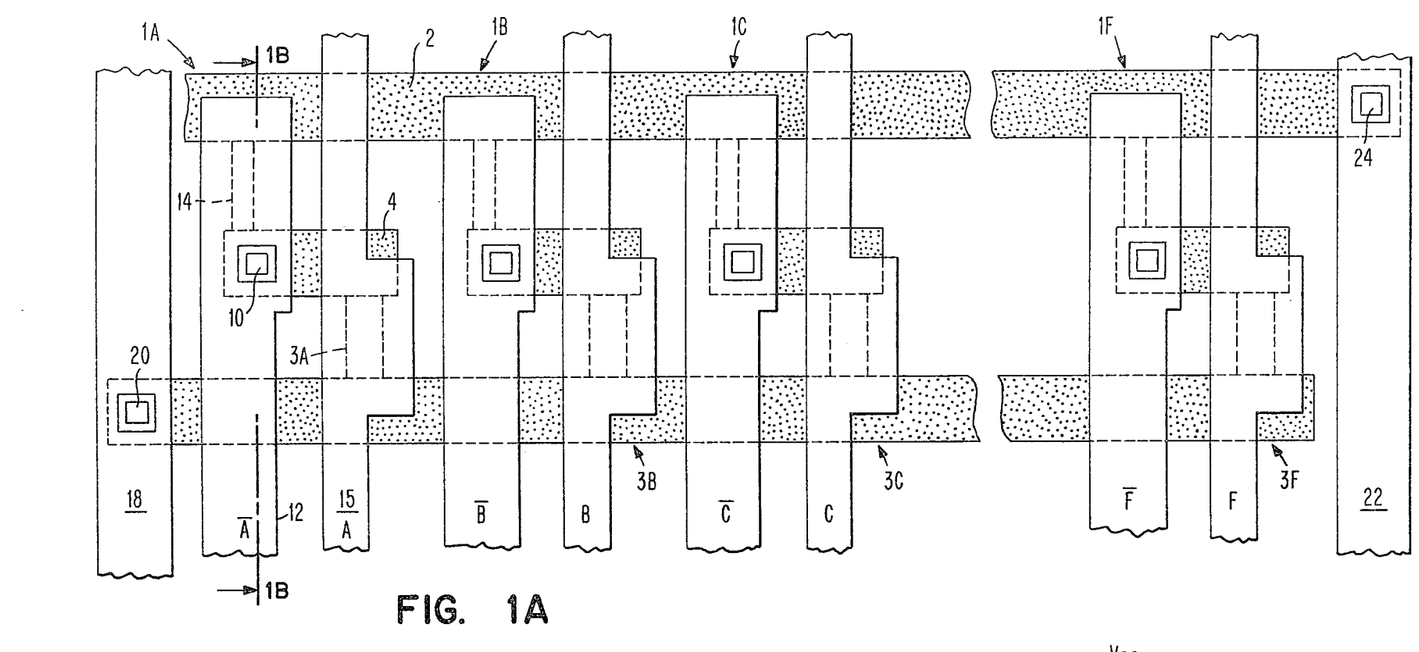
FIG. 1a illustrates a programmable logic array decoder which is composed of a parallel array of two device inverters, each inverter employing the improved FET depletion mode load device 1.
Figure 1B:
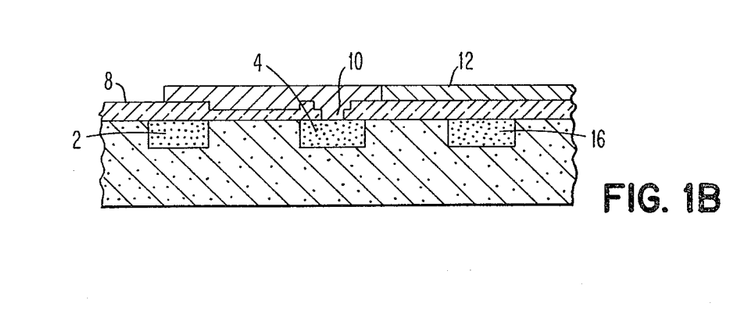
Figure 1C:
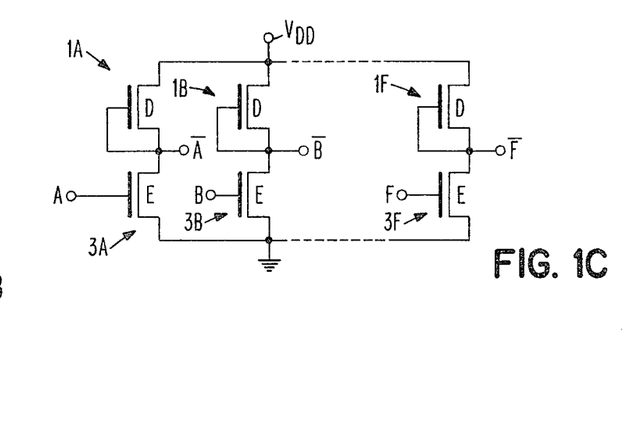

FIG. 1a illustrates an array of enhancement mode/depletion mode FET inverter circuits employing the FET depletion mode load device invention. The circuit is laid out as a plurality of inverters so as to serve as the decoder circuit driving a programmable logic array. The programmable logic array may be laid out as a modified Weinberger array. A cross sectional view along the line B—B prime of the FET depletion mode load device 1a of FIG. 1a is shown in FIG. 1b. A circuit schematic diagram of the PLA decoder of FIG. 1a is shown in FIG. 1c. The FET depletion mode load device invention finds particular application in an FET logic function layout including a spaced parallel array of horizontal diffusion segments 2, 4, and 16 shown in FIG. 1a, in the surface of a semiconductor substrate 5. An insulating layer 8 is deposited over the surface of the substrate 5 and a spaced parallel array of vertical metallized lines 12, 15, 18 and 22 are deposited over the insulation layer 8.

The FET depletion mode load device 1a maybe used in static logic circuit technology. The structure of the FET depletion mode load device is better appreciated by referring to both FIG. 1a and the cross sectional view in FIG. 1b. The first one of the horizontal diffusion segments 2 serves as the drain diffusion of the FET static load device 1a. A second one of the horizontal diffusion segments 4 spaced from the first horizontal diffusion 2, serves as the source diffusion of the FET static load device 1a. The first horizontal diffusion 2 is juxtaposed with the second horizontal diffusion 4 and defines a channel region 6 therebetween in the substrate. The insulating layer 8 has a thinner portion 14 over the channel region 6 and a via-hole perforation 10 over the second horizontal diffusion 4. A vertical metallized line 12 is deposited over the first and second diffusion segments 2 and 4, respectively forming an electrically conducted source contact with the second horizontal diffusion 4 through the via-hole 10, forming the gate electrode for the FET device 1a by the close proximity of the metal in the thinner portion 14 of the insulating layer 8, to the channel region 6, and forming the output electrode 12 for the FET device 1a.

It is seen that the number of metallized lines and via holes necessary to the structure of the FET load device 1a is reduced from that required in the prior art, thereby increasing the horizontal circuit packing density for circuits employing that load device.

An FET inverter is formed by connecting the FET depletion mode load device 1a to the FET enhancement mode logic device 3a as is shown in FIGS. 1a and 1c. A third one of the horizontal diffusion segments 16 in the substrate 5, is spaced from the second horizontal diffusion 4 and connected to a source voltage supply through the vertical metallized line 18, so as to serve as the source diffusion of the FET logic device 3a. The second horizontal diffusion 4 is juxtaposed with a third horizontal diffusion 16 and defines a second channel region therebetween. Insulating layer 8 has a thinner portion over this second channel region for the FET logic device 3a and a second gate metallization 15 lies over the insulating layer 8 over this second channel region. In this manner, the FET logic device 3a is formed. The key metallization 15 serves as the input electrode for the inverter. The first vertical metallized line 12 of the FET static load device 1a serves as the output terminal for the enhancement/depletion inverter thus formed. It is seen with reference to FIG. 1a, that the horizontal circuit packing density for the array of enhanced/depletion inverters is increased by making use of the FET depletion mode load device invention.

Figure 2A:
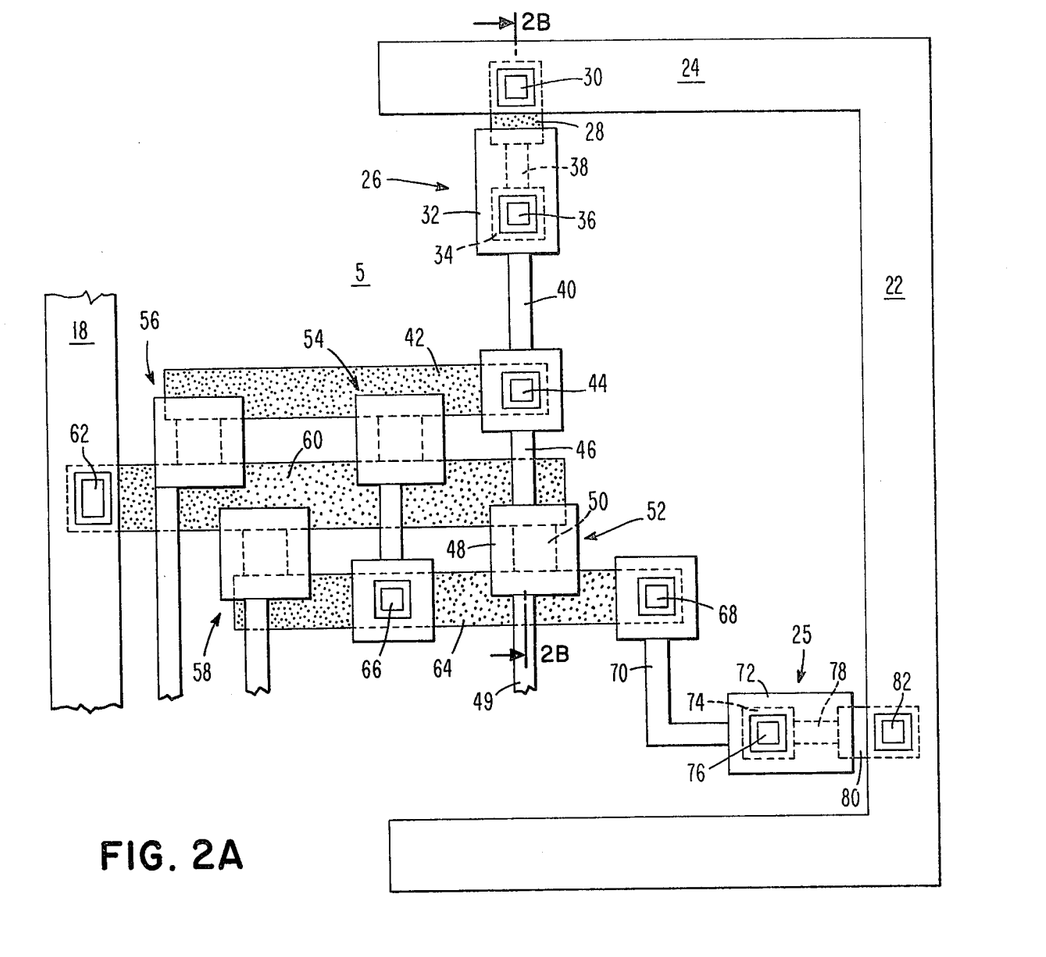
FIG. 2a illustrates a flip-flop circuit which employs another embodiment of the improved FET depletion mode load structure.
Figure 2B:
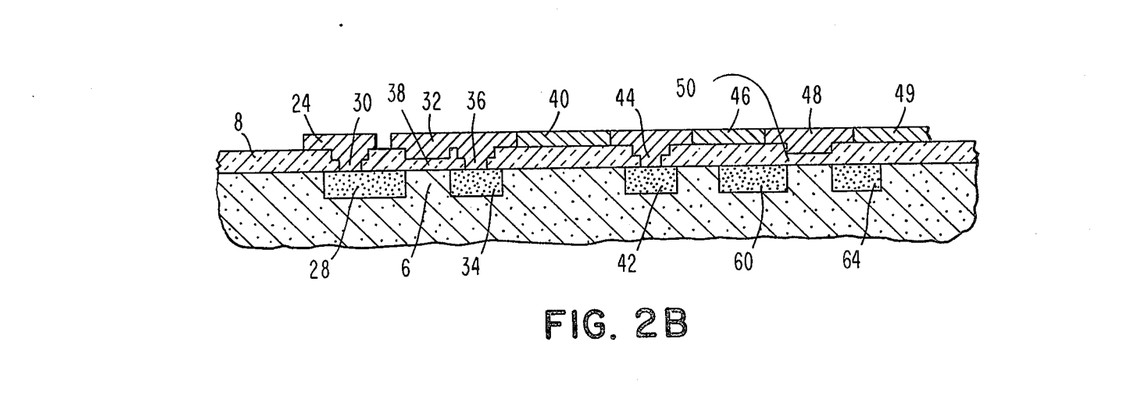
FIG. 2b is a cross sectional view along the lines B—B prime of FIG. 2a showing the improved FET load device structure.
Figure 2C:
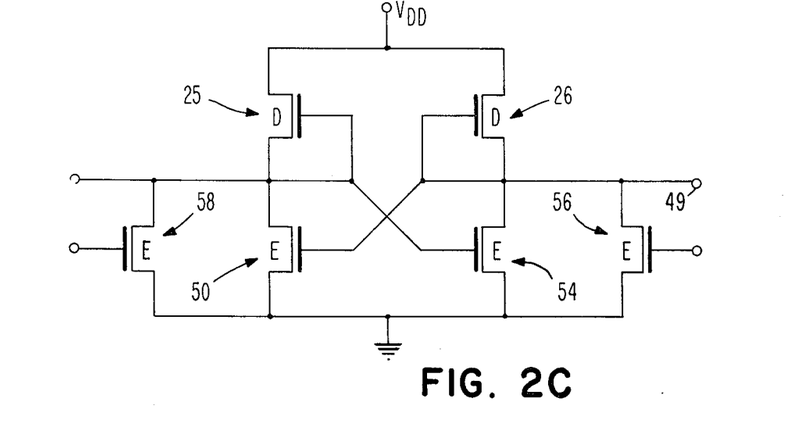

FIG. 2a illustrates an enhancement mode/depletion mode flip-flop circuit employing another embodiment of the FET depletion mode load device invention. FIG. 2b is a cross sectional view of the FET depletion mode load device 26 shown in FIG. 2a, illustrating how advantage may be taken of the compact configuration of the load device in the construction of standard logic circuits. FIG. 2c is a schematic diagram illustrating the circuit interconnection of the various identically numbered elements as shown in FIG. 2a. The vertical metallized bus bar 22 is connected to the horizontal metallized bus bar 24 which is connected by the via hole 30 to the diffusion 28 of the FET depletion mode loade 26. Drain voltages are supplied to the load device by means of the bus bars 22 and 24. The via-hole 82 connects the vertical metallized bus bar 22 to the diffusion 80 of the depletion mode load device 25. One of the features of this layout approach is the flexibility with which the depletion mode load devices may be connected to the drain potential bus bars, namely that load device 26 is connected to a horizontal metallized bus bar whereas load device 25 is connected to a vertical metallized bus bar 22. The gate metal 32 of the load device 26 may connect the load device 26 to the balance of the circuit by means of a metallized line 40 or alternately the diffusion 34 may be merged with the diffusion 42 where the circuit is to be made compact in the vertical direction. A better illustration of the overall structure of the bus bars 18, 22 and 24 may be seen where the ground bus bar 18 in the FIG. 2a is equivalent to the ground bus bar 106 in FIG. 3. The vertical VVD bus bar 22 in FIG. 2a is equivalent to the vertical bus bar 104 in FIG. 3, and the horizontal bus bar 24 of FIG. 2a is equivalent to the horizontal bus bar 108 of FIG. 3.

Figure 2D:
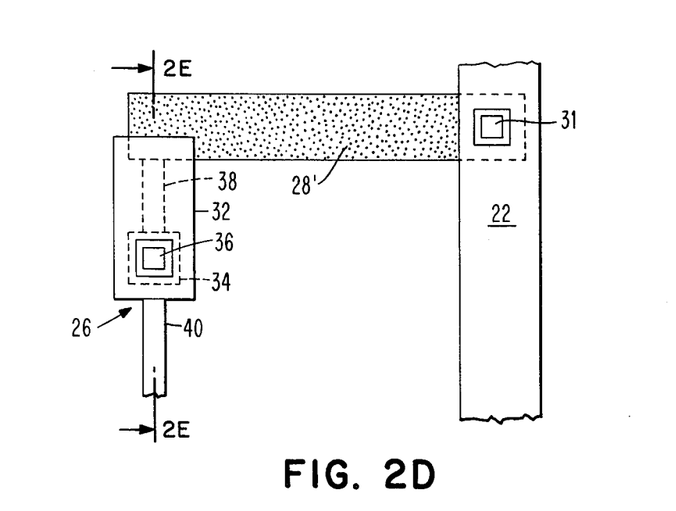
Figure 2E:
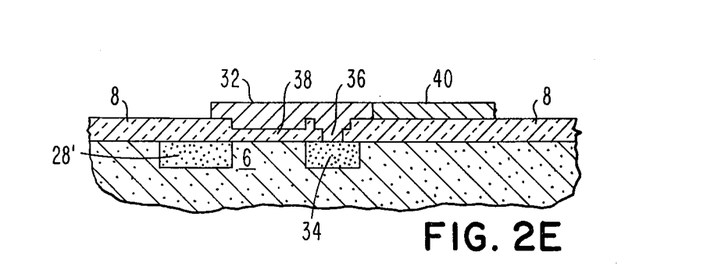
FIG. 2e is a cross sectional view along the line E—E prime of FIG. 2d.

FIGS. 2d and 2e illustrate an optional arrangement bussing in the horizontal direction where, instead of employing a metallized bus bar 24 of FIG. 2a the horizontal diffused bus bar 28 prime of FIG. 2d may be substituted therefore by extending the diffusion 28 of FIG. 2a in the horizontal direction and contacting the diffusion 28 prime with the vertical metallized bus bar 22 by virtue of the via hole 31. This option illustrated in FIG. 1, allows additional flexibility in the arrangement of circuits in the layout shown in FIGS. 2a and 3.

Figure 3A:
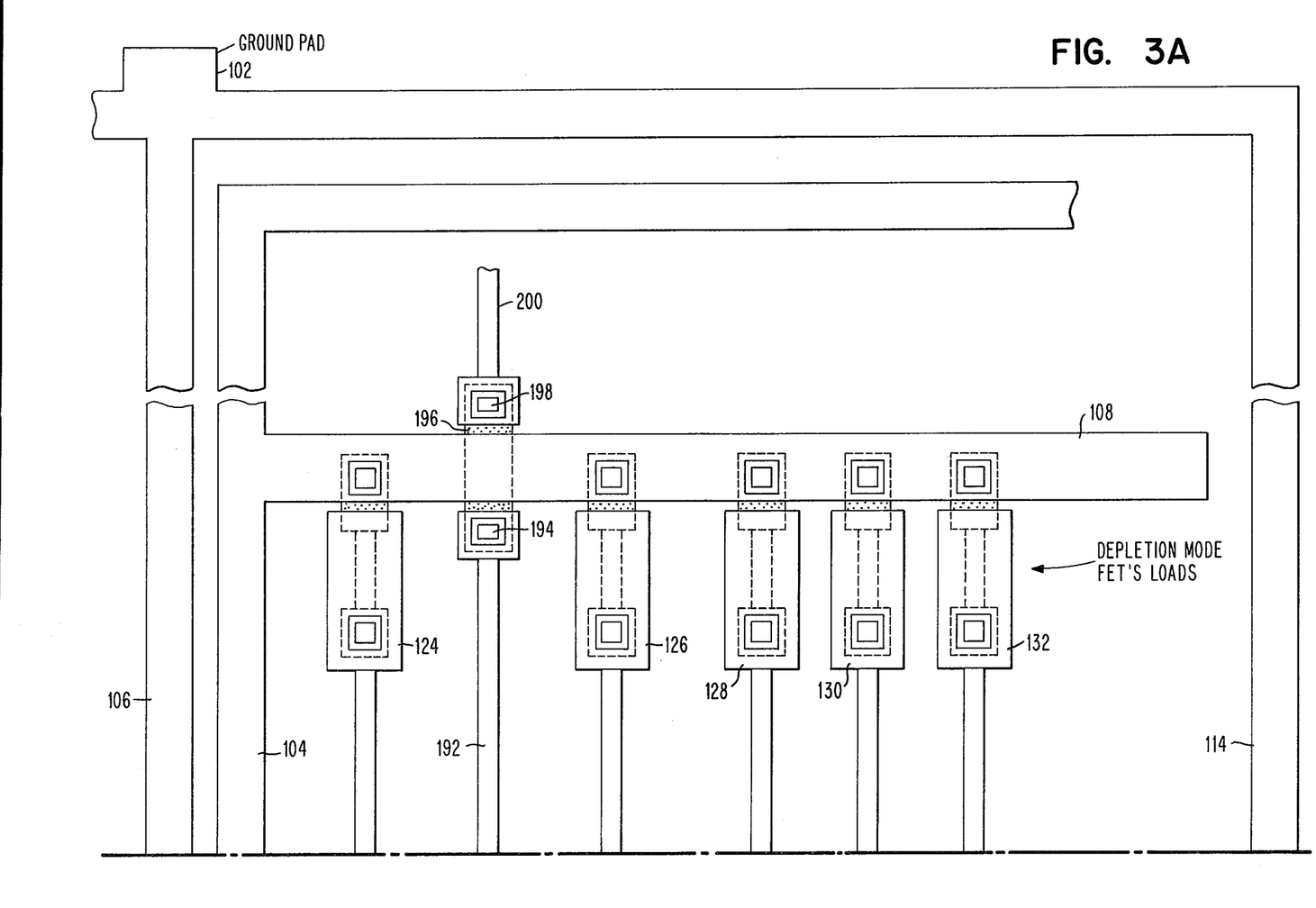
FIG. 3 illustrates an example of the layout of several FET circuits employing depletion mode load devices in a large scale integrated structure.
Figure 3B:
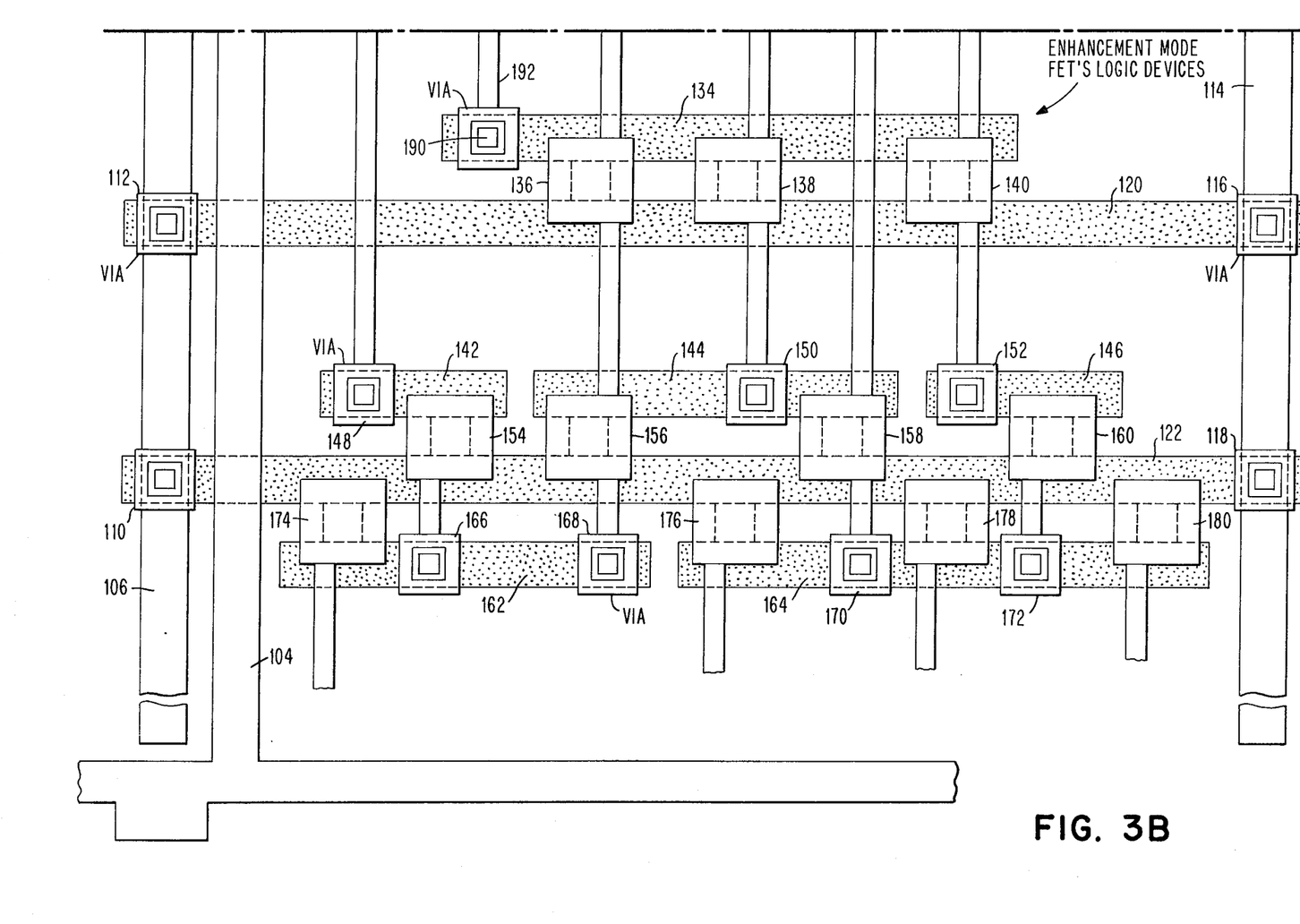

Reference to FIG. 3 will show that a better distribution for the ground current maybe obtained by employing two vertical ground bus bars 106 and 114. Via hole connections 110 and 112 connect vertical bus bar 106 to the horizontal diffusions 122 and 120 respectively which are in turn connected to vertical metallized bus bar 114 by means of via hole connections 118 and 116, respectively.

Reference to FIG. 3 will illustrate the flexibility with which the FET depletion mode load device invention and bus bar layout can be employed to generate a variety of integrated circuit configurations. The spaced parallel array of horizontal diffusion segments 134, 120, 142, 144, 146, 122, 162, and 164 lie in the surface of the semiconductor substrate 5. An insulating layer 8 is deposited over the surface of the substrate 5 and a spaced parallel array of vertical metallized lines 106, 104, and 114, etc. are deposited over the insulation layer 8. A first one of the vertical metallized lines 104 is connected to the drain supply voltage through the VDD pad 100. Another vertical metallized line 106 is connected to the source ground voltage supply through the ground pad 102. FET depletion mode load devices 124, 126, 128, 130 and 132 are shown clustered next to the horizontal metallized bus bar 108 connecting to the vertical metallized bus bar 104. With the clustering of the depletion mode load devices in this manner, a metallized horizontal bus bar 108 can be used to minimize successive voltage drops along the bus due to the substantial current flow therethrough.

FIG. 3 illustrates that the layout permits multiple source rails to be driven. A column may contain two ground busses. A Weinberger image requires a fixed amount of column height for each circuit that is added to the column. Given 10 circuits of "Y" height, the average amount of vertical height used per column would be:

$$\text{Vert Col. } H = 10Y - X$$

where "x" is the wiring channels gained due to source sharing.

The image shown in FIG. 3 has the following advantages.

1. Load devices are placed horizontally across the column. Additional circuits placed in a column would not necessarily require an increase in column height.
2. The number of circuits placed on a source rail is limited only by wiring and physical space.
3. Load devices can be moved randomly across the column to accomodate most efficient wiring.
4. Drain diffusions are kept at a minimum length required to support the circuit gates and wirings thus ultimately providing smaller gates sizes and faster circuits.
5. Load devices are connected to the circuits by metal, thus reducing net capacitance and series resistance.
6. With the two ground bus structure shown, two paths are provided for current, thus lowering the voltage drop across the source rail, resulting in smaller gate sizes.
7. Due to the increased density, wiring lengths are kept at a minimum.

A generalized equation describing circuit height is as follows.

$$CHB = (K_1/K_2) \times 6 + LDH - \text{per } VDD \text{ rail.}$$

where:
CBH — Circuit Block Height in Wiring Channels.
$K_1$ — Number of Circuits per Block
$K_2$ — Average Number of Circuits per Source Rail
6 — Represents the number of wiring channels per source - shared block.
LDH — Load Device Height (Constant)

FIG. 3 indicates a bussing structure to support the circuit structure described above. The number of horizontal rails per column will be a function of number of load devices to be supported. This structure allows for a two sided ground bus and may be repeated several times across the chip. Global wiring between blocks will require diffusion underpasses such as 196 shown in FIG. 3, connecting metal line 192 to metal line 200 going to another block. This structure allows for wiring between blocks and for placement of load devices around the entire VDD bus structure.

While the invention has been particularly shown and described with reference to the preferred embodiments thereof, it will be understood by those skilled in the art that the foregoing and other changes in form an details can be made therein without departing from the spirit and the scope of the invention.

We claim:

1. In an FET logic function layout including a spaced parallel array of horizontal diffusion segments in the surface of a semiconductor substrate, an insulating layer deposited over the surface of the substrate, and a spaced parallel array of vertical metallized lines deposited over the insulation layer, wherein an improvement in the configuration of an FET depletion mode load device in a static logic array, comprises:
   a first one of said horizontal diffusion segments, to serve as the drain diffusion of the FET static load device;
   a second one of said horizontal diffusion segments spaced from said first horizontal diffusion, to serve as the source diffusion of the FET static load device;
   said first horizontal diffusion juxtaposed with said second horizontal diffusion and defining a channel region therebetween in said substrate;
   said insulating layer having a thinner portion over said channel region and a via-hole perforation over said second horizontal diffusion;
   a vertical metallized line deposited over said first and second diffusion segments, forming an electrically conductive source contact with said second horizontal diffusion through said via hole, forming the gate electrode by its close proximity in said thinner portion of said insulator, to said channel region, and forming the output electrode for the device;
   whereby the number of metallized lines and via holes necessary to the structure of said FET load device is reduced, thereby increasing the horizontal circuit packing density.

2. The circuit structure of claim 1, as applied in a decoder circuit.

3. The circuit structure of claim 2, wherein said decoder circuit drives a programmable logic array.

4. The circuit structure of claim 1, which further comprises:
   a third one of said horizontal diffusion segments in said substrate spaced from said second horizontal diffusion and connected to a source voltage supply to serve as the source diffusion of an FET logic device;
   said second horizontal diffusion juxtaposed with said third horizontal diffusion and defining a second channel region therebetween;
   said insulating layer having a thinner portion over said second channel region and a second gate metallization over said insulating layer over said second channel region;
   whereby said first vertical metallized line of said FET static load device provides an output terminal for said FET logic device.

5. The circuit structure of claim 4, as applied in a decoder circuit.

6. The circuit structure of claim 4, wherein said decoder circuit drives a programmable logic array.

7. In an FET logic function layout including a spaced parallel array of horizontal diffusion segments in the surface of a semiconductor substrate, an insulating layer deposited over the surface of the substrate and a spaced parallel array of vertical metallized lines deposited over the insulating layer, wherein an improvement in the configuration of an FET static logic array, comprises:
   a first one of said vertical metallized lines being connected to a drain supply voltage;
   a first horizontal metallized line connected to said first vertical metallized line, for supplying a drain current;
   a first one of said horizontal diffusion segments in said substrate, partially beneath said first horizontal metallized line, having a via contact thereto, to serve as the drain of an FET static load device;
   a second one of said horizontal diffusion segments spaced from said first horizontal diffusion, to serve as the source diffusion of the FET static load device;
   said first horizontal diffusion juxtaposed with said second horizontal diffusion and defining a channel region therebetween in said substrate;
   said insulating layer having a thinner portion over said channel region and a via-hole perforation over said second horizontal diffusion;
   a second vertical metallized line deposited over said channel region forming an electrically conductive source contact with said second horizontal diffusion through said via hole, forming the gate electrode by its close proximity in said thinner portion of said insulator, to said channel region, and forming the output electrode for the device;
   whereby the packing density of a static FET integrated circuit is increased.

8. The circuit structure of claim 7, as applied in a decoder circuit.

9. The circuit structure of claim 8, wherein said decoder circuit drives a programmable logic array.

10. The circuit structure of claim 7, which further comprises:
    a third one of said horizontal diffusion segments in said substrate spaced from said second horizontal diffusion and connected to a source voltage supply to serve as the source diffusion of an FET logic device;
    said second horizontal diffusion juxtaposed with said third horizontal diffusion and defining a second channel region therebetween;
    said insulating layer having a thinner portion over said second channel region and a second gate metallization over said insulating layer over said second channel region;
    whereby said second vertical metallized line of said FET static load device provides an output terminal for said FET logic device.

11. The circuit structure of claim 10, wherein said load device is vertically displaced from said FET logic device for which it serves as a load device.

12. The circuit structure of claim 10, as applied in a decoder circuit.

13. The circuit structure of claim 12, wherein said decoder circuit drives a programmable logic array.

14. The circuit structure of claim 10, which further comprises:
    a third vertical metallized line connected to said source voltage supply;
    said third horizontal diffusion segment being connected to said third vertical metallized line, for supplying source current to said FET logic device.

15. The circuit structure of claim 7, which further comprises:

a third horizontal diffusion segment in said substrate, partially beneath said second vertical metallized line, having a via contact thereto, to serve as the drain of an FET logic device;

a fourth horizontal diffusion segment in said substrate spaced from said third horizontal diffusion, to serve as the source diffusion of the FET logic device;

said third horizontal diffusion segment juxtaposed with said fourth horizontal diffusion segment and defining a second channel region therebetween in said substrate;

said insulating layer having a thinner portion over said second channel region and a second gate metallization over said insulating layer over said second channel region;

a third vertical metallized line connected to said source voltage supply;

said fourth horizontal diffusion segment being connected to said third vertical metallized line, for supplying source current to said FET logic device.

16. In an FET logic function layout including a spaced parallel array of horizontal diffusion segments in the surface of a semiconductor substrate, an insulating layer deposited over the surface of the substrate and a spaced parallel array of vertical metallized lines deposited over the insulating layer, wherein an improvement in the configuration of an FET static logic array, comprises:

a first one of said vertical metallized lines being connected to a drain supply voltage;

a first horizontal metallized line connected to said first vertical metallized line, for supplying a drain current;

a second vertical metallized line being connected to a source supply voltage;

a third vertical metallized line being connected to said source supply voltage, and spaced from said second vertical metallized line so that said first vertical metallized line lies therebetween;

a first one of said horizontal diffusion segments in said substrate, partially beneath said first horizontal metallized line, having a via contact thereto, to serve as the drain of an FET static load device;

a second one of said horizontal diffusion segments spaced from said first horizontal diffusion, to serve as the source diffusion of the FET static load device;

said first horizontal diffusion juxtaposed with said second horizontal diffusion and defining a channel region therebetween in said substrate;

said insulating layer having a thinner portion over said channel region and a via-hole perforation over said second horizontal diffusion;

a fourth vertical metallized line deposited over said channel region forming an electrically conductive source contact with said second horizontal diffusion through said via hole, forming the gate electrode by its close proximity in said thinner portion of said insulator, to said channel region, and forming the output electrode for the device;

whereby the number of metallized lines and via holes necessary to the structure of said FET load device is reduced, thereby increasing the horizontal circuit packing density.

17. The circuit structure of claim 16, which further comprises:

a third one of said horizontal diffusion segments in said substrate spaced from said second horizontal diffusion and connected to said second vertical metallized line to serve as the source diffusion of an FET logic device;

a fourth horizontal diffusion segment in said substrate, juxtaposed with said third horizontal diffusion and defining a second channel region therebetween;

said insulating layer having a thinner portion over said second channel region and said fourth vertical metallized line forming a second gate metallization over said insulating layer over said second channel region;

whereby said fourth vertical metallized line of said FET static load device provides an output terminal for said FET logic device.

18. The circuit structure of claim 17, which further comprises:

said third horizontal diffusion segment having a portion located between said second and third vertical metallized lines;

said third horizontal diffusion connected to said third metallized line;

whereby a more uniform source current distribution may be obtained.

19. In an FET logic function layout including a spaced parallel array of horizontal diffusion segments in the surface of a semiconductor substrate, an insulating layer deposited over the surface of the substrate and a spaced parallel array of vertical metallized lines deposited over the insulating layer, wherein an improvement in the configuration of an FET static logic array, comprises:

a first one of said vertical metallized lines being connected to a drain supply voltage;

a first horizontal metallized line connected to said first vertical metallized line, for supplying a drain current;

a second vertical metallized line being connected to a source supply voltage;

a plurality of first said horizontal diffusion segments in said substrate, partially beneath said first horizontal metallized line, each having a via contact thereto, to serve as the drains of a plurality of FET static load devices;

a plurality of second said horizontal diffusion segments each respectively spaced from each of said plurality of first horizontal diffusions, to serve as the source diffusions of said plurality of FET static load devices;

each of said plurality of first horizontal diffusions respectively juxtaposed with each of said second plurality of horizontal diffusions and defining channel regions therebetween in said substrate;

said insulating layer having thinner portions over each of said channel regions and via hole perforations over each said plurality of second horizontal diffusions;

a plurality of third vertical metallized lines deposited respectively over each of said channel regions forming electrically conductive source contacts with each of said plurality of second horizontal diffusions through said respective via holes, forming a plurality of gate electrodes by close proximity in said each respective thinner portion of said insulator to said respective channel regions, and forming a plurality of output electrode for each respective device;

whereby the number of metallized lines and via holes necessary to the structure of said plurality of FET load devices is reduced, thereby increasing the horizontal circuit packing density.

20. The circuit structure of claim 19, which further comprises:
a third one of said horizontal diffusion segments in said substrate spaced from said plurality of second horizontal diffusions and connected to said second vertical metallized line to serve as the source diffusion of an FET logic device;
a plurality of fourth horizontal diffusion segments in said substrate, respectively juxtaposed with said third horizontal diffusion and respectively defining a plurality of second channel regions therebetween;
said insulating layer having thinner portions over each of said second channel regions and said plurality of third vertical metallized lines forming a second plurality of gate metallization over said insulating layer over respective ones of said second channel regions;
whereby said plurality of third vertical metallized lines of said plurality of FET static load devices provide output terminals for said plurality of FET logic devices.

21. The circuit structure of claim 20, which further comprises:
a fourth vertical metallized line being connected to said source supply voltage, and spaced from said second vertical metallized line so that, said first vertical metallized line lies therebetween;
said plurality of third and fourth horizontal diffusion segments having a portion located between said second and third vertical metallized lines;
said plurality of third horizontal diffusion connected to said third metalized line;
whereby a more uniform source current distributes may be obtained.

* * * * *